(12) United States Patent
Fulford et al.

(10) Patent No.: US 12,131,956 B2
(45) Date of Patent: Oct. 29, 2024

(54) ULTRA DENSE 3D ROUTING FOR COMPACT 3D DESIGNS

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Jacksonville, FL (US)

(73) Assignee: Tokyo Electron Limited, Tokyo (JP)

( * ) Notice: Subject to any disclaimer, the term of this patent is extended or adjusted under 35 U.S.C. 154(b) by 247 days.

(21) Appl. No.: 17/453,212

(22) Filed: Nov. 2, 2021

(65) Prior Publication Data
US 2022/0359312 A1     Nov. 10, 2022

Related U.S. Application Data

(60) Provisional application No. 63/186,062, filed on May 7, 2021.

(51) Int. Cl.
| | |
|---|---|
| *H01L 21/8238* | (2006.01) |
| *H01L 21/822* | (2006.01) |
| *H01L 27/092* | (2006.01) |
| *H01L 29/78* | (2006.01) |

(52) U.S. Cl.
CPC .. *H01L 21/823885* (2013.01); *H01L 21/8221* (2013.01); *H01L 21/823814* (2013.01); *H01L 21/823871* (2013.01); *H01L 27/092* (2013.01); *H01L 29/7827* (2013.01)

(58) Field of Classification Search
None
See application file for complete search history.

(56) References Cited

U.S. PATENT DOCUMENTS

2022/0139786 A1\* 5/2022 Gardner .............. H01L 29/7827
                                                                              438/212

\* cited by examiner

*Primary Examiner* — Hsien Ming Lee
(74) *Attorney, Agent, or Firm* — Oblon, McClelland, Maier & Neustadt, L.L.P.

(57) ABSTRACT

A method of microfabrication includes epitaxially growing a first vertical channel structure of silicon-containing material on a first sacrificial layer of silicon containing material, the first sacrificial layer having etch selectivity with respect to the vertical channel structure. A core opening is directionally etched through the vertical channel structure to expose the first sacrificial layer, and the first sacrificial layer is isotropically etched through the core opening to form a first isolation opening for isolating the first vertical channel structure.

10 Claims, 17 Drawing Sheets

(a)

(b)

(a)

(b)

ULTRA DENSE 3D ROUTING FOR COMPACT 3D DESIGNS

CROSS REFERENCE TO RELATED APPLICATIONS

The present application claims the benefit of U.S. Prov. Ser. No. 63/186,062, entitled "Ultra Dense 3D Routing For Compact 3D Designs", filed on May 7, 2021 and incorporated herein by reference in its entirety.

BACKGROUND

Field of the Invention

This disclosure relates to microelectronic devices including semiconductor devices, transistors, and integrated circuits, including methods of microfabrication.

Description of the Related Art

The background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In the manufacture of a semiconductor device (especially on the microscopic scale), various fabrication processes are executed, such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is a subject of research.

Accordingly, it is an object of the present disclosure to provide methods and devices for manufacturing a 3D semiconductor having 3D metal formation. Performance and speed of the 3D semiconductor can be achieved by optimizing metal routing path lengths.

SUMMARY OF THE INVENTION

Aspects of the present disclosure include methods of metal routing for vertical channel 3D transistor devices. A cap layer etching in a contained area gives the freedom to place contacts anywhere on the device which makes high density routing possible. In aspects, different 3D metal integration methods using different types of metal in different regions of PMOS and NMOS structures are described. 3D metal formation can be formed around 90 degree angles. Higher device performance and speed can be achieved by optimizing metal routing path lengths.

An aspect (1) includes a method of microfabrication which includes forming a first layer stack on a substrate of alternating layers, the first layer stack layer having at least two sub-stacks, each sub-stack including a first metal layer positioned between two dielectric layers of a first dielectric material, the first metal layer and the two dielectric layers of the first dielectric material separated from each other by layers of a second dielectric material. Vertical channel structures are formed extending through a channel opening of the first layer stack including a vertical channel structure for each sub-stack, the vertical channel structures formed by epitaxial growth, the vertical channel structures having a current flow path that is perpendicular to a surface of the substrate, the vertical channel structures for each sub-stack positioned so that the first metal layer is aligned for a gate contact and the two dielectric layers of the first dielectric material are aligned for source/drain contacts. For each sub-stack, metal openings are formed in the first layer stack that uncover the first metal layer and the two dielectric layers of the first dielectric material, wherein each metal opening is separated from other metal openings, wherein the openings are positioned at a particular radial location of the vertical channel structures. The method further includes isotropically removing accessible portions of the first dielectric material through the metal openings, and filling the metal openings with a second metal resulting in second metal structures that extend horizontally from the vertical channel structures and vertically to a location above the vertical channel structure.

An aspect (2) includes the method of aspect (1), wherein the forming metal openings in the first layer stack results in a staircase profile opening of the first metal layer and the two dielectric layers of a first dielectric material.

An aspect (3) includes the method of aspect (1), further including isolating remaining portions of the first metal layer and remaining portions of the two dielectric layers of a first dielectric material from the vertical channel structures.

An aspect (4) includes the method of aspect (1), wherein openings for a given vertical channel structure are in a radially extending line with each other and positioned at a different radial location as compared to openings of a second vertical channel structure.

An aspect (5) includes the method of aspect (1), wherein forming the vertical channel structures includes depositing a silicide metal which interfaces with the second dielectric material.

An aspect (6) includes the method of aspect (5), wherein the silicide metal is annealed prior to forming the metal openings in the first layer stack.

An aspect (7) includes the method of aspect (1), wherein a first vertical channel structure of a first sub-stack includes a p-silicon material and a second vertical channel structure of a second sub-stack includes an n-silicon material, wherein the first vertical channel is a PMOS vertical channel structure, and the second vertical channel is an NMOS vertical channel structure.

An aspect (8) includes the method of aspect (7), wherein a first silicide metal is deposited for NMOS vertical channel structures and a second silicide metal is deposited for PMOS vertical channel structures.

An aspect (9) includes the method of aspect (8), wherein the first silicide metal and the second silicide metal are different metal materials.

An aspect (10) includes the method of aspect (8), wherein the first silicide metal and the second silicide metal are the same metal material.

An aspect (11) includes a method of microfabrication which includes epitaxially growing a first vertical channel structure of silicon-containing material on a first sacrificial layer of silicon containing material, the first sacrificial layer having etch selectivity with respect to the vertical channel structure. A core opening is directionally etched through the vertical channel structure to expose the first sacrificial layer; and the first sacrificial layer is isotropically etched through the core opening to form a first isolation opening for isolating the first vertical channel structure.

An aspect (12) includes the method of aspect (11), wherein the forming a first isolation opening includes forming an isolation opening for isolating the vertical channel structure from an underlying substrate.

An aspect (13) includes the method of aspect (11), further including filling the first isolation opening and the core opening with an isolation dielectric.

An aspect (14) includes the method of aspect (11), further including epitaxially growing a second sacrificial layer on the first vertical channel structure, and epitaxially growing a second channel structure on the second sacrificial layer to provide a stack of vertical channel structures. The directionally etching includes directionally etching a core opening through the stack of first and second vertical channel structures to expose the first and second sacrificial layers. The isotropically etching includes isotropically etching the first and second sacrificial layers through the core opening to form first and second isolation openings for isolating the stack of vertical channel structures.

An aspect (15) includes the method of aspect (14), further including filling the first and second isolation openings and the core opening with an isolation dielectric.

An aspect (16) includes the method of aspect (15), further including forming independent source/drain (S/D) and gate metal contacts for the first vertical channel structure at a first radial location on the stack of vertical channel structures, and forming independent source/drain (S/D) and gate metal contacts for the second vertical channel structure at a second radial location on the stack of vertical channel structures.

An aspect (17) includes the method of aspect (11), further including forming a gate dielectric structure at a gate location of the first vertical channel structure during the epitaxially growing the first vertical channel structure.

An aspect (18) includes the method of aspect (11), further including forming silicide metal structures at respective source/drain (S/D) locations of the first vertical channel structure during the epitaxially growing the first vertical channel structure.

An aspect (19) includes the method of aspect (18), further including annealing the silicide metal structures to form silicide contacts for the S/D locations.

An aspect (20) includes a semiconductor device including a vertical channel transistor formed on a substrate, the vertical channel transistor including a vertical channel structure of semiconductor material which forms a transistor current path that is substantially perpendicular to a surface of the substrate. A core dielectric structure extends through the vertical channel structure along the transistor current path, the core dielectric structure being contained within the vertical channel structure. An isolation dielectric structure is in communication with the core dielectric structure and extending through the vertical channel structure to electrically isolate the vertical channel transistor.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
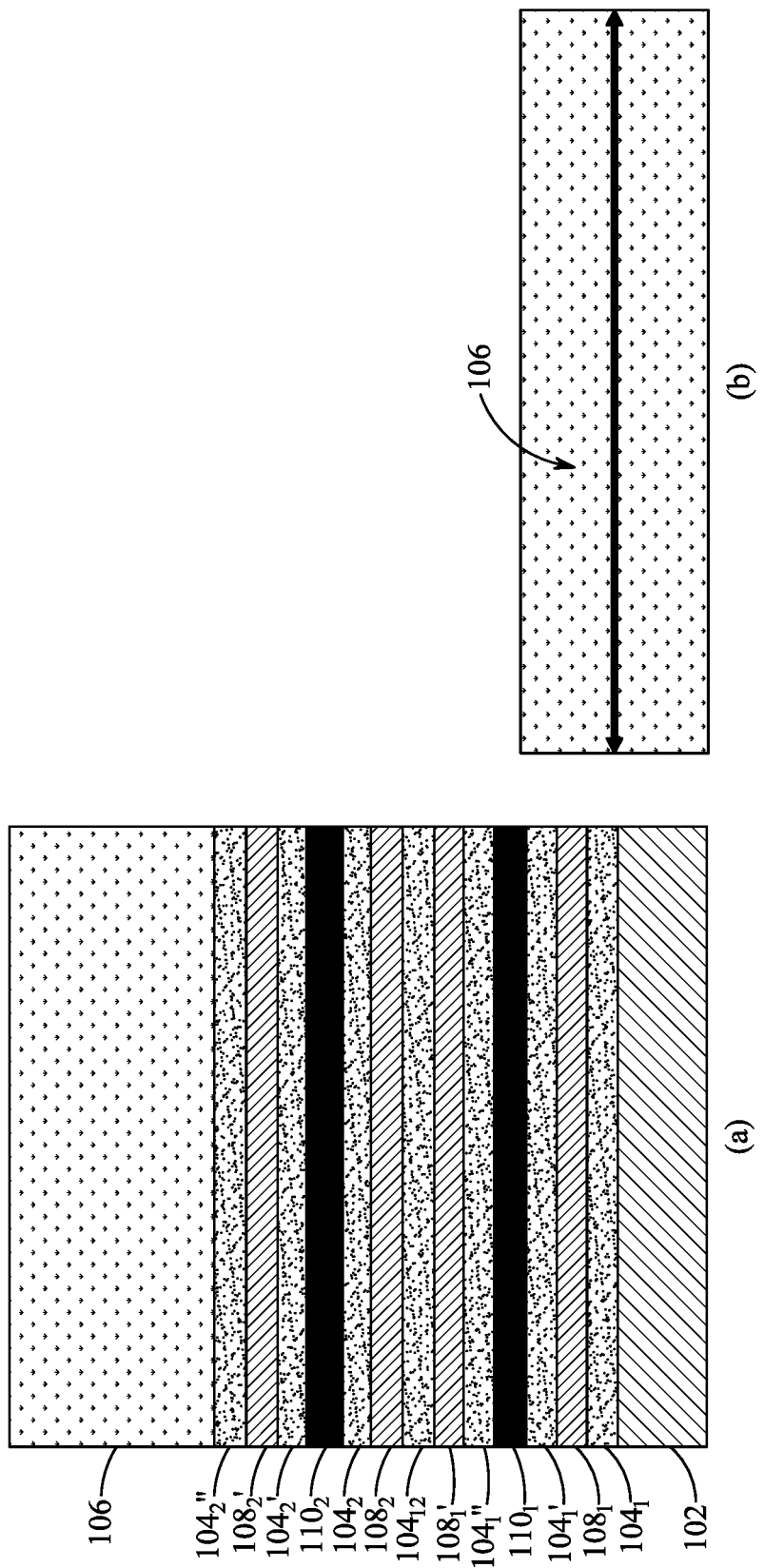
FIG. 1 illustrates a layer stack on a substrate, according to certain embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Aspects of the present disclosure include methods of metal routing for vertical channel 3D transistor devices. A cap layer etching in a contained area of the cap layer on the vertical channel gives the freedom to place contacts anywhere on the device around the channel which makes high density routing possible. In aspects, different 3D metal integration methods using different types of metal in different types (e.g., PMOS and NMOS) of structures are described. 3D metal formation can be formed around 90 degree angle paths. Higher device performance and speed can be achieved by optimizing metal routing path lengths. Further, higher density circuits may be produced at a reduced cost using the techniques described herein.

Aspects of the present disclosure describe examples being two devices high (N=2), but there may be any number N of stacked devices due to 360 degree symmetry of the device architecture. N may be bounded by structural limitations of repeated stacking one set of layers upon a next set of layers. For example, N may be anywhere from one to ten layers, and may be greater depending on structural limitations and device specifications.

In aspects of the present disclosure, three invention process flows are described.

Option 1 is a core process flow that utilizes a 3D device having N=2 transistors with cap layer etching in a contained area, which gives the freedom to put contacts anywhere on the device, which makes high density routing possible.

Option 2 is a core process flow similar to option 1 using a different silicide material for each of a P—Si device and an N—Si device, wherein both devices have a Metal 2 filling.

Option 3 is a core process flow in which the same silicide for both the P—Si device and the N—Si device.

Referring now to the drawings, wherein like reference numerals designate identical or corresponding parts throughout the several views.

Referring now to FIG. 1, cross-sectional view (*a*) shows a layer stack of alternating layers is formed on a substrate 102 or on a layer of semiconductor material. Layer 102 may be a silicon semiconductor material. The layer stack includes layers of three different materials. One material is a metal and the other materials are dielectrics with different etch resistivity. These layers are referred to as metal 1, dielectric 1, and dielectric 8. Multiple sub-stacks of layers can be formed with a repeating pattern of layers. Formation of a first sub-stack begins with depositing layers on the substrate in the following order: layer $104_1$ of dielectric 1, layer $108_1$ of dielectric 8, layer $104_1{}'$ of dielectric 1, layer $110_1$ of metal 1, layer $104_1{}''$ of dielectric 1, layer $108_1{}'$ of dielectric 8, and layer $104_{12}$ of dielectric 1. In the embodiment of FIG. 1, transitions between sub-stacks share a layer of dielectric 1. Alternatively a third dielectric can be used as a transition layer between sub-stacks.

In the example of FIG. 1, two sub-stacks are formed, each with a layer of metal 1 positioned between two layers of dielectric 8, with layers of dielectric 1 alternating after each layer and separating the layers from each other. The second sub-stack includes the shared layer $104_{12}$ of dielectric 1, as well as layer $108_2$ of dielectric 8, layer $104_2$ of dielectric 1, layer $110_2$ of metal 1, layer $104_2{}'$ of dielectric 1, layer $108_2{}'$ of dielectric 8, and layer $104_2{}''$ of dielectric 1 sequentially formed on the shared layer $104_{12}$ of dielectric 1. Finally a capping layer 106 of dielectric 2 can be deposited over the layer $104_2{}''$. Each dielectric layer of a substack is of a material which can be etched without etching other dielectric materials and metals. Such etch selectivity of materials are generally known in semiconductor manufacturing. Non-limiting examples of dielectric materials are silicon dioxide ($SiO_2$), titanium dioxide ($TiO_2$), silicon nitride ($Si_3N_4$), silicon oxynitride ($Si_2N_2O$), silicon carbide (SiC), or variations thereof such as $Si_xO_y$, $Si_xN_y$, and $SiO_xN_y$. High-K materials, such as oxynitrides, $O_xN_y$, may also be used as a dielectric herein.

Metal 1, metal 2, metal 3 and metal 4 can be selected from a group including ruthenium (Ru), tantalum (Ta), titanium (Ti), tungsten (W), gallium (Ga), gadolinium (Gd), molybdenum (Mo), aluminum (Al), copper (Cu) or combinations thereof. Variations such as tantalum nitride (TaN), titanium nitride (TiN), titanium carbide (TiC), titanium oxynitride (TiON), tantalum silicon nitride (TaSiN), titanium silicon nitride (TiSiN) and tungsten nitride (WN) may also be used.

High-K dielectrics may be selected from the group including aluminum oxide ($Al_2O_3$), aluminum nitride (AlN), zirconium dioxide ($ZrO_2$), hafnium dioxide ($HfO_2$), hafnium silicates ($HfSiO_x$), zirconium silicates (ZrSiOx), hafnium oxynitrides (HfOxNy), zirconium oxynitrides (ZrOxNy), hafnium zirconium nitrides (HfxZryOz), tantalum oxide ($Ta_2O_5$) lanthanum oxide ($La_2O_3$) yttrium oxide ($Y_2O_3$), niobium pentoxide ($Nb_2O_5$) titanium oxide ($TiO_2$) praseodymium(III) oxide ($Pr_2O_3$) gadolinium(III) oxide ($Gd_2O_3$) silicon boron nitride (SiBN), boron carbon nitride (BCN), hydrogenated boron carbide and the like.

In the figures, a) illustrates a side cross-section of a substrate segment, and b) illustrates a top view of the substrate segment. In FIG. 1, (b) shows the top view depicting the dielectric layer 106. The arrow shows the width of the layer stack.

Figure 2:
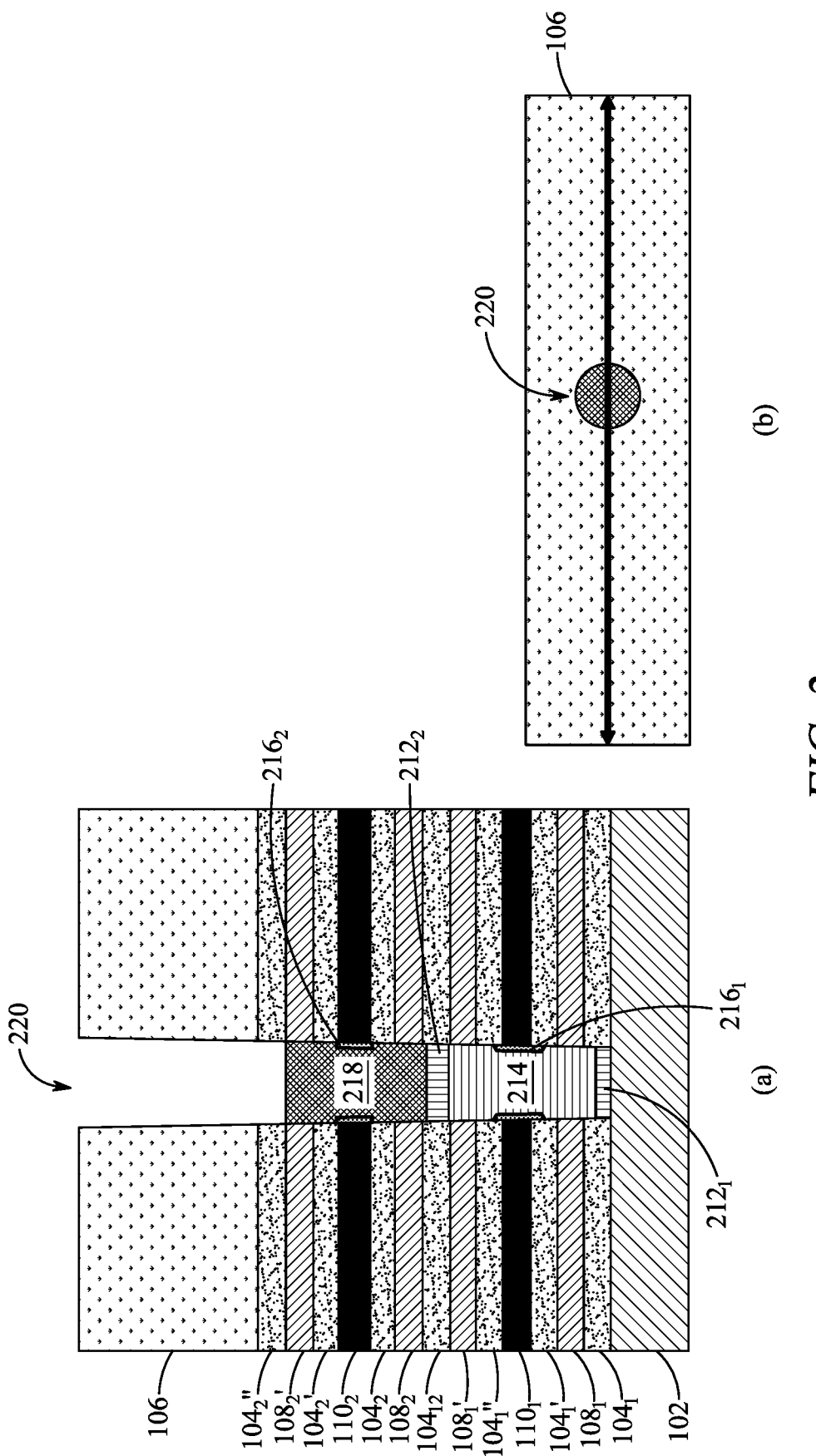
FIG. 2 illustrates vertical channel structures, where $a$) is a cross-sectional view and $b$) is a top view, according to certain embodiments.

In FIG. 2, (a) shows that vertical channel structures are formed within an opening 220 formed in the layer stack. Only one opening 220 is shown for the sake of clarity, however a plurality of openings including vertical structures may be formed simultaneously. In one embodiment, an etch mask is formed to directionally etch vertical opening 220 in the layer stack which extends down to the substrate 102 or an overlying layer of semiconductor material, such as silicon. The exposed silicon serves as a seed layer for epitaxial growth of another semiconductor layer, such as a silicon germanium, SiGe, p doped silicon (p-Si) or n doped silicon (n-Si). In the example of FIG. 2, a first layer $212_1$ of SiGe is grown at the bottom of the opening 220 for later removal to isolate the lower vertical channel 214 from the layer of silicon. P-doped silicon 214 is then epitaxially grown as a first (lower) vertical channel structure in the first sub-stack over the SiGe layer $212_1$.

Initial growth of the p-doped silicon 214 is performed to fill the opening to a level of the first high-k interface $216_1$. The first high-k interface $216_1$ can then be formed by conformal deposition (e.g. atomic layer deposition (ALD)) of high-k dielectric material followed by directional etch back. The directional etch back leaves a lining of high-k material on the sidewall of the opening 220, with a lower portion of the lining to form a first gate oxide structure between the metal 1 layer $110_1$ and the p-doped vertical channel structure. Epitaxial growth of the p-doped silicon 214 is then resumed from a surface of the initially grown p-doped silicon that is exposed by the directional etch back of the high-k material. After the growth of the p-doped silicon extends above layer $110_1$ of metal 1 to cover the high-k material forming the first gate oxide structure $216_1$, isotropic removal of the high-k dielectric material is performed to remove the remaining upper portion of the lining of high-k material from a sidewall of the opening 220. This forms a first gate oxide structure between the metal 1 layer $110_1$ and the p-doped vertical channel structure 214. Epitaxial growth of the p-doped silicon is then resumed to complete the p-doped silicon structure 214. Alternative process flows to form the first high-k interface $216_1$ may include selective deposition and/or selective etch techniques known in the art.

A second layer $212_2$ of SiGe is grown between sub-stacks to isolate the second sub-stack from the first sub-stack. A vertical channel structure 218 of n-doped silicon is then grown in the opening 220 in the second sub-stack with a second high-k interface $216_2$ formed by atomic layer deposition (ALD) deposition of the high-k dielectric followed by directional etch back to form a second gate oxide structure at the layer $110_2$ of metal 1 interface. In FIG. 2, the top view (b) shows layer 106 at the top of the substrate with vertical channel 218 formed in opening 220.

Figure 3:
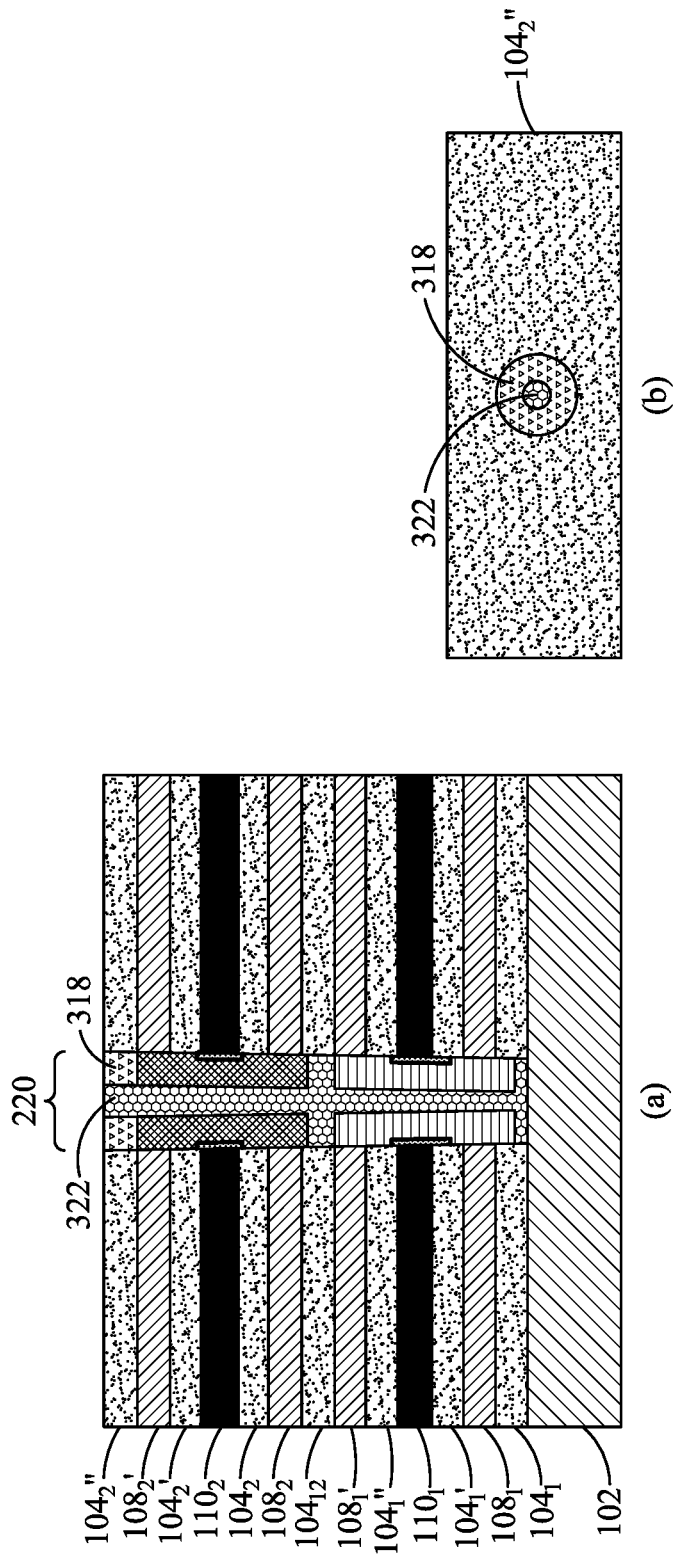
FIG. 3 depicts a core formed in the vertical channel structures, where $a$) is a cross-sectional view and $b$) is a top view, according to certain embodiments.

In FIG. 3, cross-sectional view (a) shows processing after growth of the vertical channel structures. A deposition of layer 318 of dielectric 3 is formed in the opening 220 in layer 106 (see FIG. 2) and $104_2$', followed by etch back of the layer 106 to create a mask to etch out a core of the vertical channel structures 214 and 218. In a non-limiting example, dielectric 3 may be a high-k dielectric. The resulting core opening can be used to isotropically remove the layers $212_1$ and $212_2$ of SiGe for isolation of vertical channel structures in each sub-stack. The hollow core can then be filled with dielectric 4, shown as 322. In a non-limiting example, dielectric 4 may be silicon nitride. In FIG. 3, the top view (b) shows the top layer $104_2$", a surrounding cap layer 318 of dielectric 3 surrounding the core 322 filled with dielectric 4.

Figure 4:
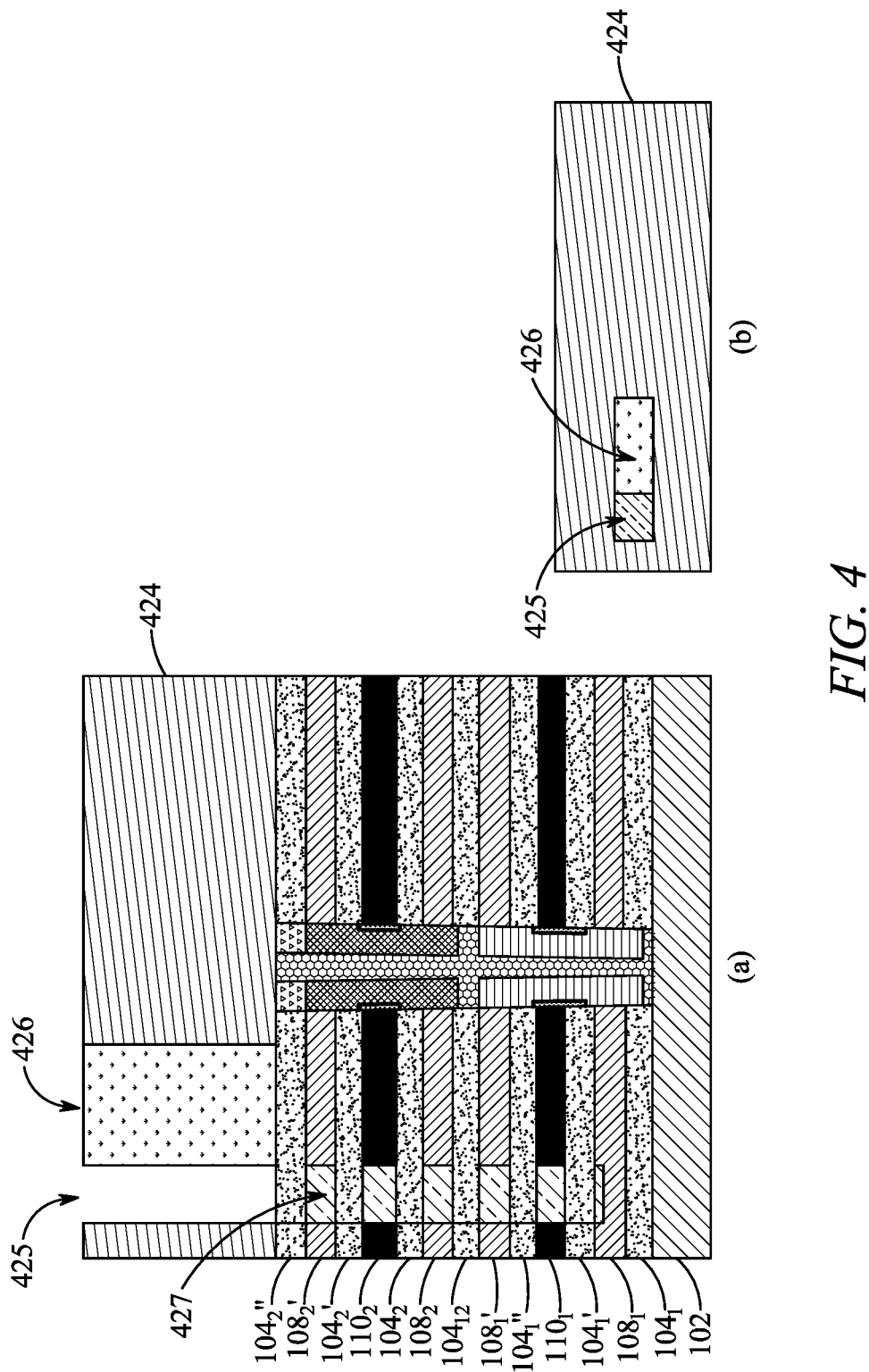
FIG. 4 depicts the formation of metallization paths, where $a$) is a cross-sectional view and $b$) is a top view, according to certain embodiments.

Next, openings are formed to create metal paths to the transistor elements. As shown in FIG. 4, the cross-sectional view (a) layer 424 of dielectric 7 is deposited on the substrate and patterned by directional etching. A layer 426 of dielectric 2 is deposited in an opening to provide a container mask to protect a region of the layer $104_2$" from etching. A container opening 425 allows etching of a first metal opening down to the top of the layer $108_1$ of dielectric 8. In a non-limiting example, dielectric 7 may be SiC. In another non-limiting example, dielectric 7 may be silicon oxynitride $Si_2N_2O$. As show in FIG. 4, cross-sectional view (a), a directional etch is performed to remove sections of metal and dielectric to reach to the bottom dielectric 8 layer $108_1$. As also shown in FIG. 4, selective deposition is performed to coat the walls of the metal 1 and dielectric 8 layers with a coating 427 of dielectric 6 to protect them from etching during the etch processes associated with forming an adjacent metal opening. A conformal protective layer may also be used. Dielectric 6 may be a high-k material, such as silicon oxynitride, $Si_2N_2O$. An opening in dielectric 2 layer 426 is spaced apart from the vertical channels. In FIG. 4, the top view (b) shows the top of the intermediate device shown in the cross-sectional view (a).

Figure 5:
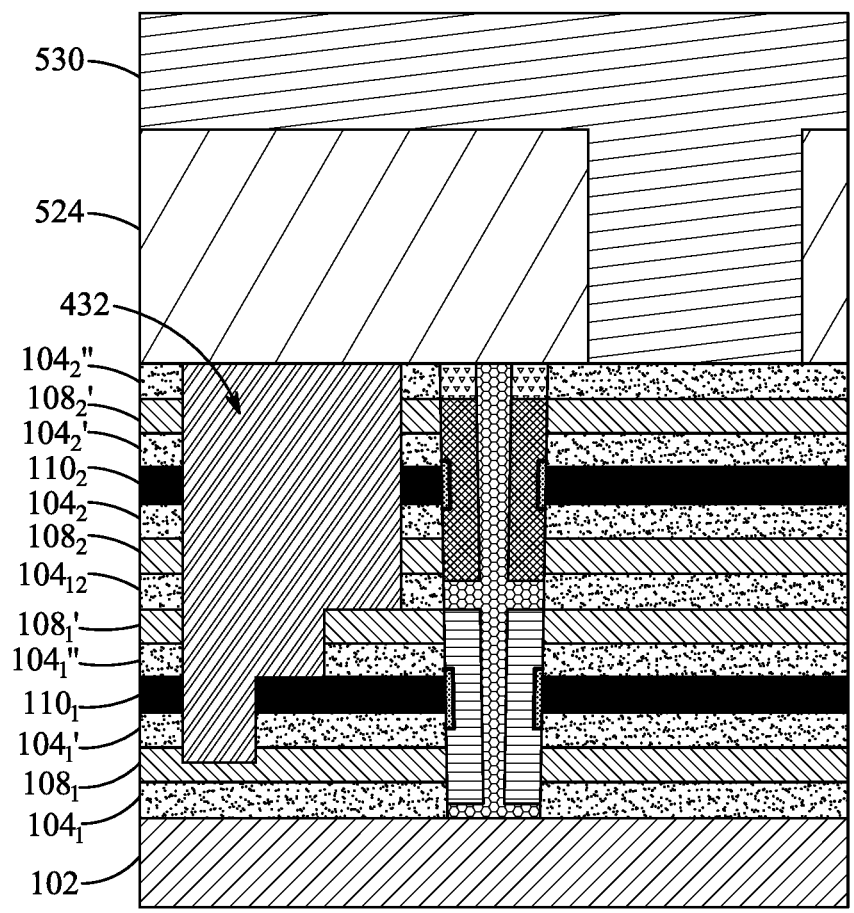
FIG. 5 depicts deposition of a dielectric in a first staircase opening in the substrate, according to certain embodiments.

The container opening 425 may then be widened to allow etching of adjacent metal openings using dielectric 2 layer 426 as a mask. Specifically, a directional etch can be performed to form a second metal opening down to the top of layer $110_1$ of metal 1, followed by selective or conformal deposition of a protective layer within the second opening. Similarly, a directional etch can be performed through the remaining portion of dielectric 2, down to the top of layer $108_1$'. The protective coatings may then be removed from the metal path openings and these deep metal openings for the lower vertical channel device filled with a deposition 432 of dielectric 5 as shown in FIG. 5.

The steps of masking and directional etching are then repeated to create shallow metal openings for the upper vertical channel device. As also seen in FIG. 5, layer 524 of dielectric 2 is deposited on the substrate and patterned by directional etching to cover the deposition 432 of dielectric 5 and to create an opening over a second portion of the layer stack for the shallow metal openings. Layer 530 is then deposited over the opening and etched back to provide a container mask that is used to directionally etch openings down to the top of layer $108_2$, the top of layer $110_2$ of metal 1, and the top of layer $108_2$' of dielectric 8, in sequence using a protective layer as previously described.

Figure 6:
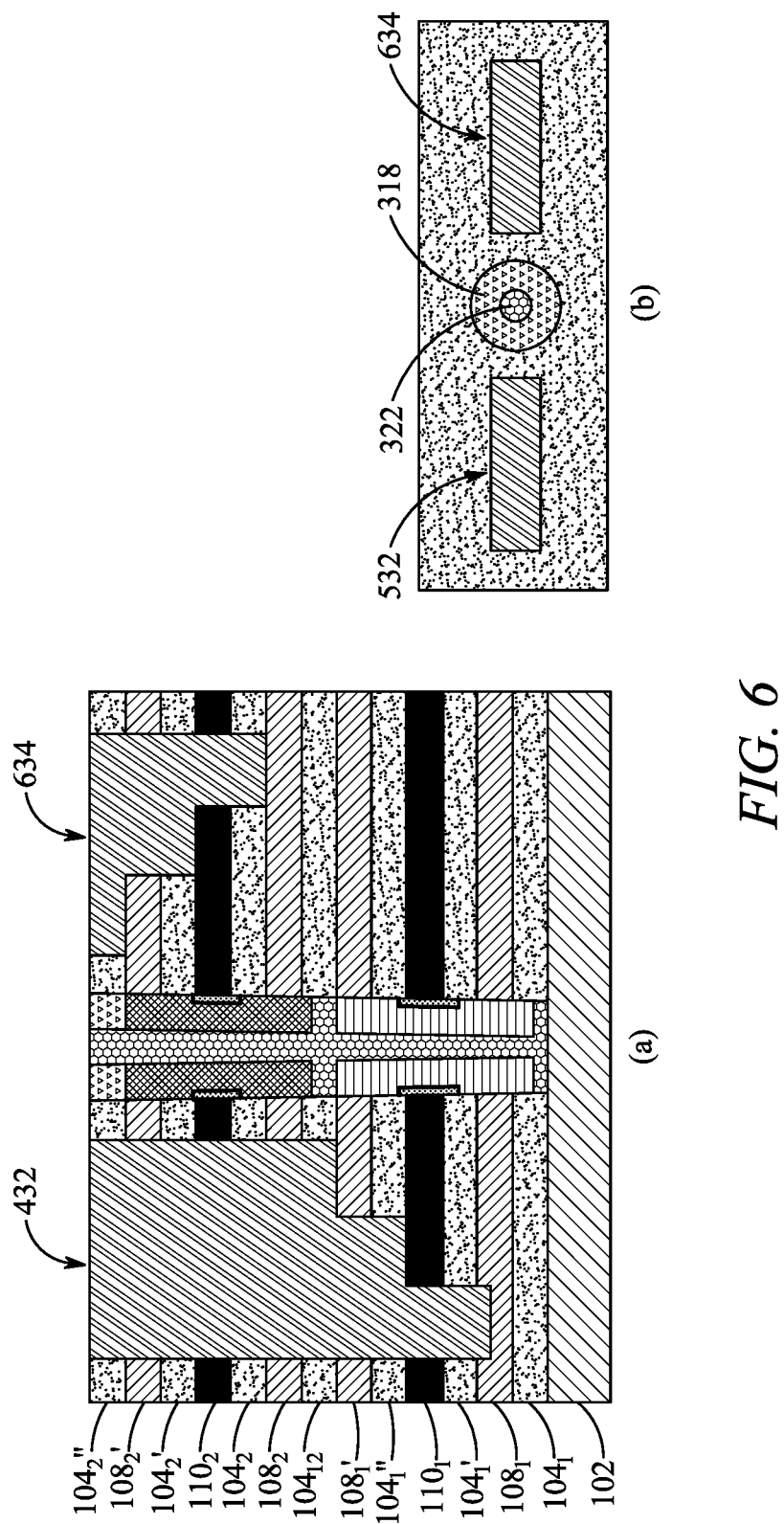
FIG. 6 depicts deposition of a dielectric in a second staircase opening in the substrate, where $a$) is a cross-sectional view and $b$) is a top view, according to certain embodiments.

FIG. 6 shows (a) cross sectional and (b) top views after filling with the deposition 634 of dielectric 5, which fills the staircase profile within the layer stack for accessing source, gate and drain layers from different spatial locations on a top of the substrate. The openings for the n-silicon contacts are filled with a deposition 634 of dielectric 5 followed by CMP. In FIG. 6, (b) shows the top view of the intermediate structure. Etch masks can used to repeat the process to create n-silicon contacts at different radial directions from the contacts for p-silicon device. Although the cross-section (a) of FIG. 6 shows the opening for the p-silicon diametrically opposed to the structure for the n-silicon contacts, the opening for the n-silicon contacts may be formed at any section surrounding the contact stack which does not overlap the p-silicon contact structure. That is, since isolation of the vertical channels is performed by an opening in the core of the vertical channels according to embodiments herein, the entire 360 degrees of a periphery of the vertical channel structures remains available for placement of device metal contacts.

Figure 7:
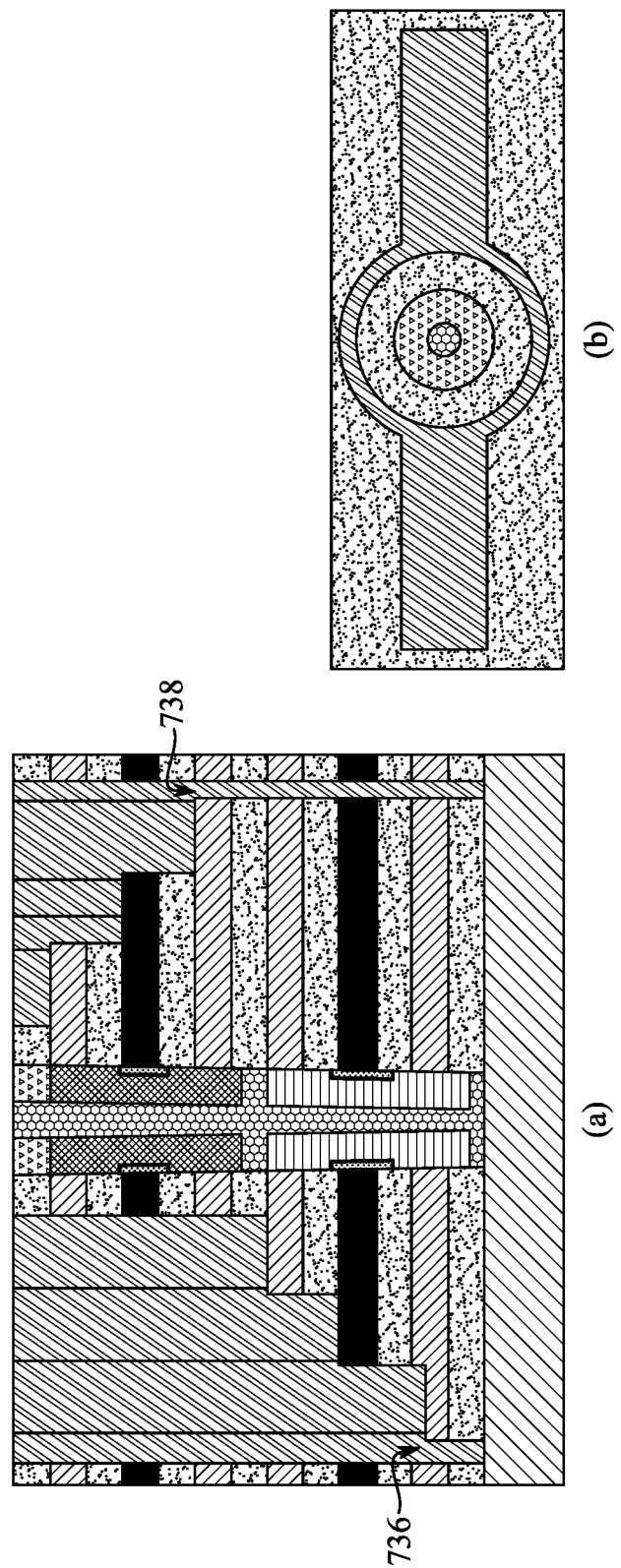
FIG. 7 depicts isolation of the device from other devices, where $a$) is a cross-sectional view and $b$) is a top view, according to certain embodiments.

In FIG. 7, cross-sectional view (a), a separate etch mask is formed and a directional etch is executed to etch openings 736 and 738 between adjacent devices. The openings extend through all layers of the layer stack until uncovering the underlying silicon layer. This separates each vertical channel stack from other devices, therefore multiple devices can make use of the same layer stack that includes metal layers of metal 1. In the example embodiment of FIG. 7, additional arc shaped isolation etch openings form a circular shape for isolation dielectric surrounding the periphery of the vertical channel stack. These opening(s) created by the isolation etch are filled with dielectric 5 and the top of the stack is planarized. In FIG. 7, (b) shows a top view of the intermediate structure of FIG. 7(a). The isolation structure of FIG. 7 may be formed according to one or more lithography, etching and deposition steps known in the art.

Figure 8:
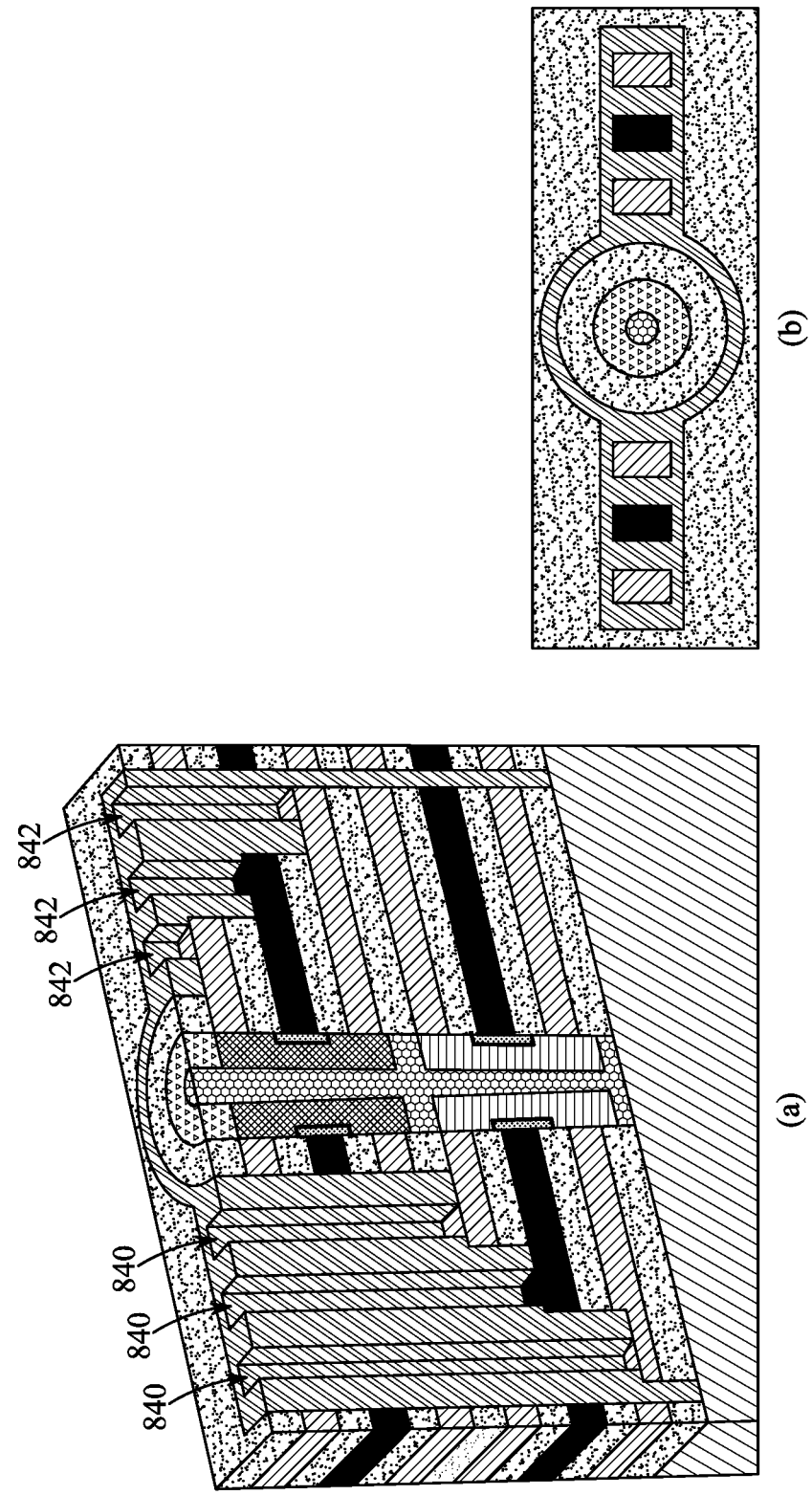
FIG. 8 depicts the formation of metallization paths, where $a$) is a cross-sectional view and $b$) is a top view, according to certain embodiments.

As shown in FIG. 8(a), a patterning mask is formed over the layers for contact etching, in which vertical openings 840 are etched into the filling of dielectric 5 to form p-silicon contacts landing or stopping on layer $108_1$ of dielectric 8, layer $110_1$ of metal 1, and layer $108_1'$ of dielectric 8. Vertical openings 842 are also etched into the filling of dielectric 5 to form n-silicon vertical openings, the openings landing or stopping on layer $110_2$ of metal 1 and layer $108_2$ and layer $108_2'$, both of dielectric 8. The patterning mask is then removed. In FIG. 8, (b) shows a top view of the device.

Figure 9:
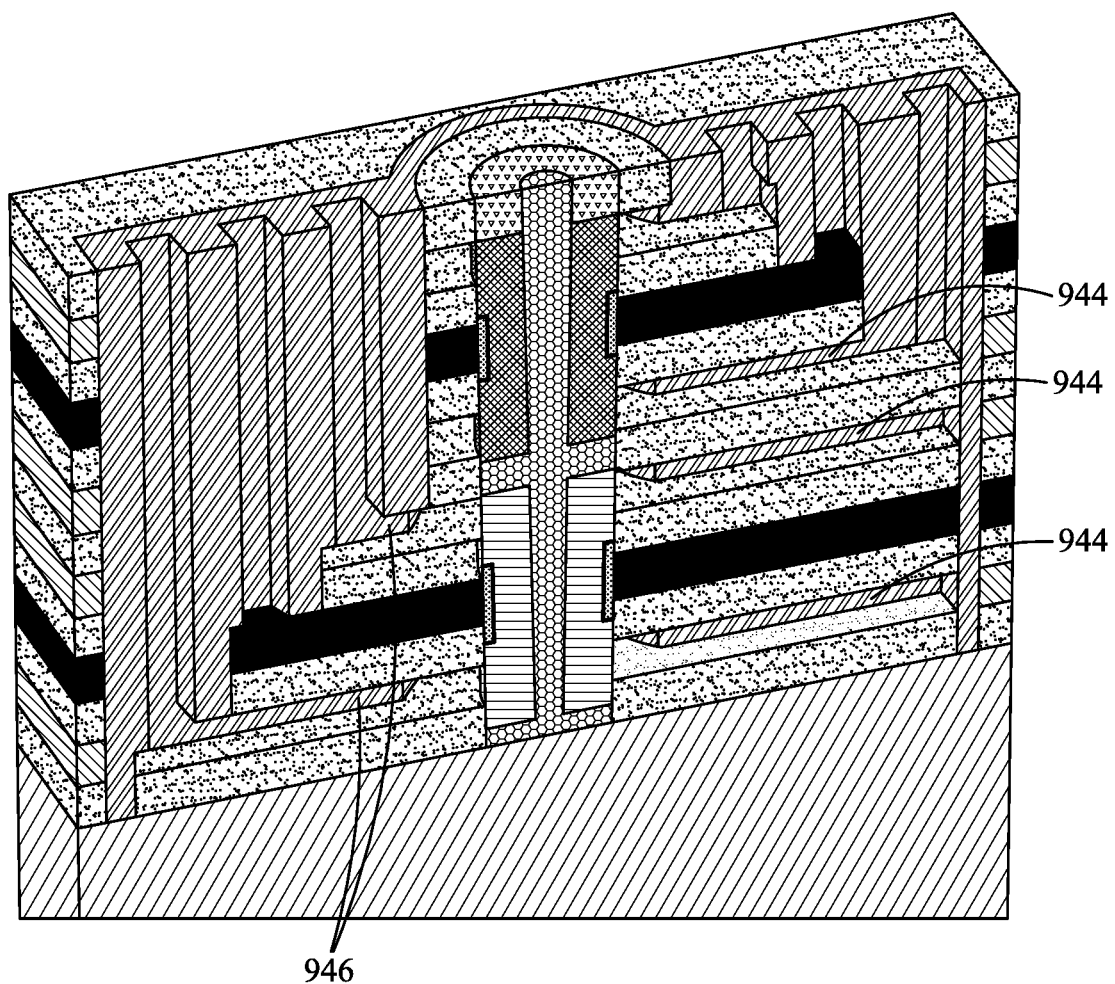
FIG. 9 depicts the formation of horizontal extensions from the metallization paths to the vertical channels, according to certain embodiments.

In FIG. 9, with dielectric 8 layer segments accessible, an isotropic etch is executed that removes accessible portions of the dielectric 8 layers, i.e., layer $108_1$, layer $108_1'$, layer $108_2$ and layer $108_2'$. This essentially removes the horizontal portions of dielectric 8 until reaching the vertical channel structures. Reference number 944 shows the horizontal openings on the right side of FIG. 9 and reference number 946 shows the horizontal openings on the left side of FIG. 9 at an intermediate stage of the isotropic etch process.

Figure 10:
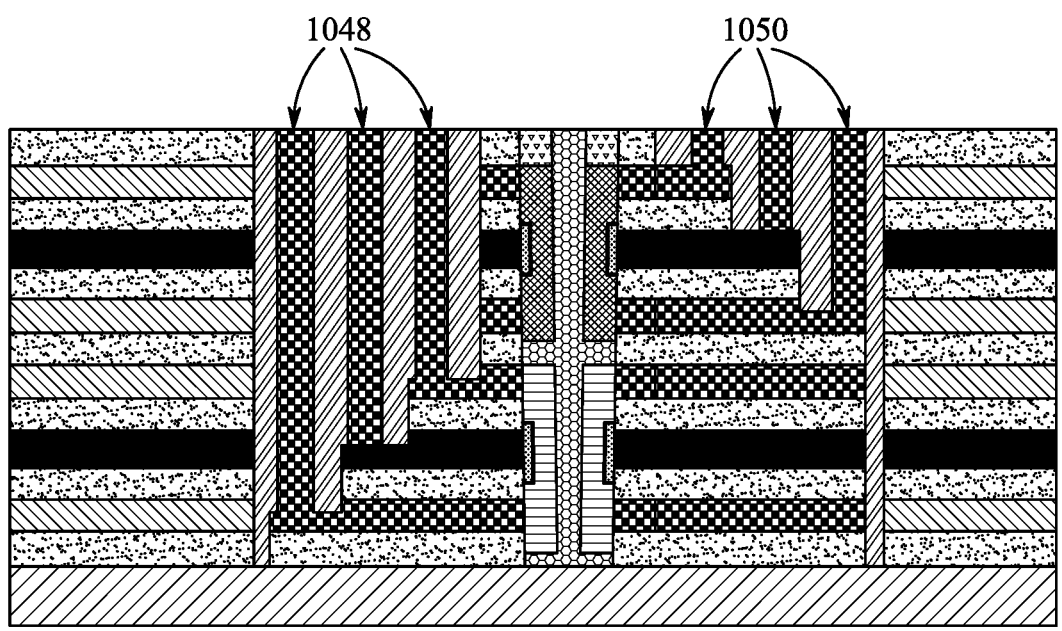
FIG. 10 shows a thin layer of metal deposited in the metallization paths, according to certain embodiments.

In FIG. 10, the layer stack is shown with metallization completed. An ALD layer or electroplating of a thin layer of metal 2 can be first executed, which enables then growing thick layers of metal 2 irrespective of bending in the path of the metal connections. Reference number 1048 shows the metal lines to the lower p-silicon source, gate and drain, and reference number 1050 shows the metal lines to the upper n-silicon source, gate and drain.

Figure 11:
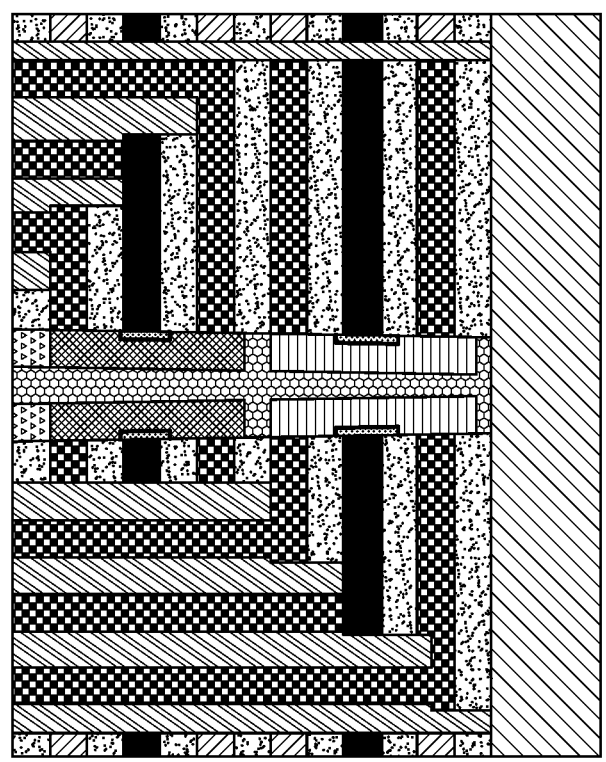
FIG. 11 depicts filling of the metallization paths with metal, where $a$) is a cross-sectional view and $b$) is a top view, according to certain embodiments.
Figure 11:
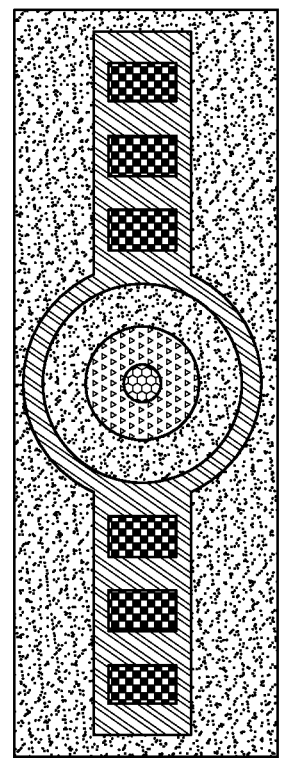

In FIG. 11, the cross-sectional view (a) shows the openings 1048 and 1050 are filled with metal 2, followed by CMP planarization. In FIG. 11, (b) shows a top view of the completed transistor.

Figure 12:
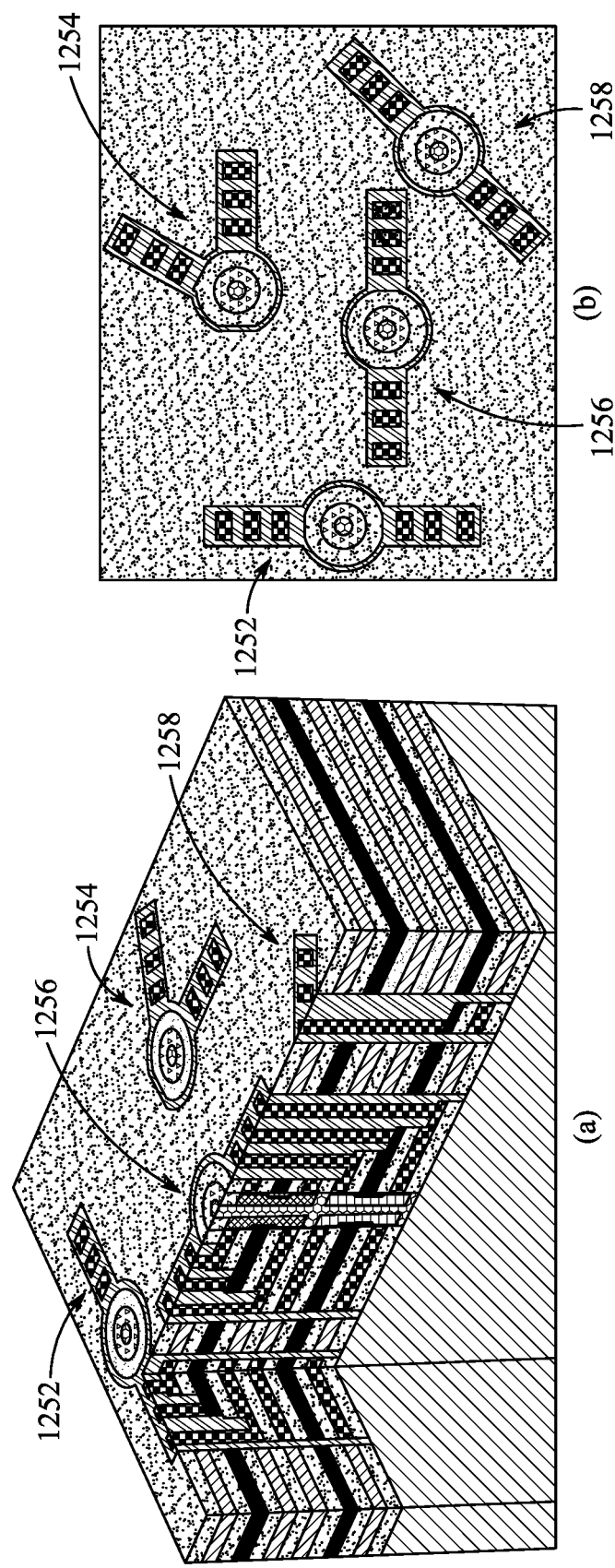
FIG. 12 shows a plurality of vertical channel transistors formed on the same substrate, where $a$) is a cross-sectional view and $b$) is a top view, according to certain embodiments.

FIG. 12 shows a perspective cross sectional view (a), in which four isolated transistors, 1252, 1254, 1256, and 1258 are made in the same layer stack. Note that a contact line for each sub-stack/device can be positioned at various radial directions based on circuit design considerations. Accordingly, cap layer etching in a contained area such as the center core of the vertical channel structures gives freedom to put contacts anywhere which enables high density routing. Dielectric etching and filling by metal to create contacts on the other hand decreases the amount of parallel metal strips across the substrate and thereby, reduces the possible inductance effects.

Figure 13:
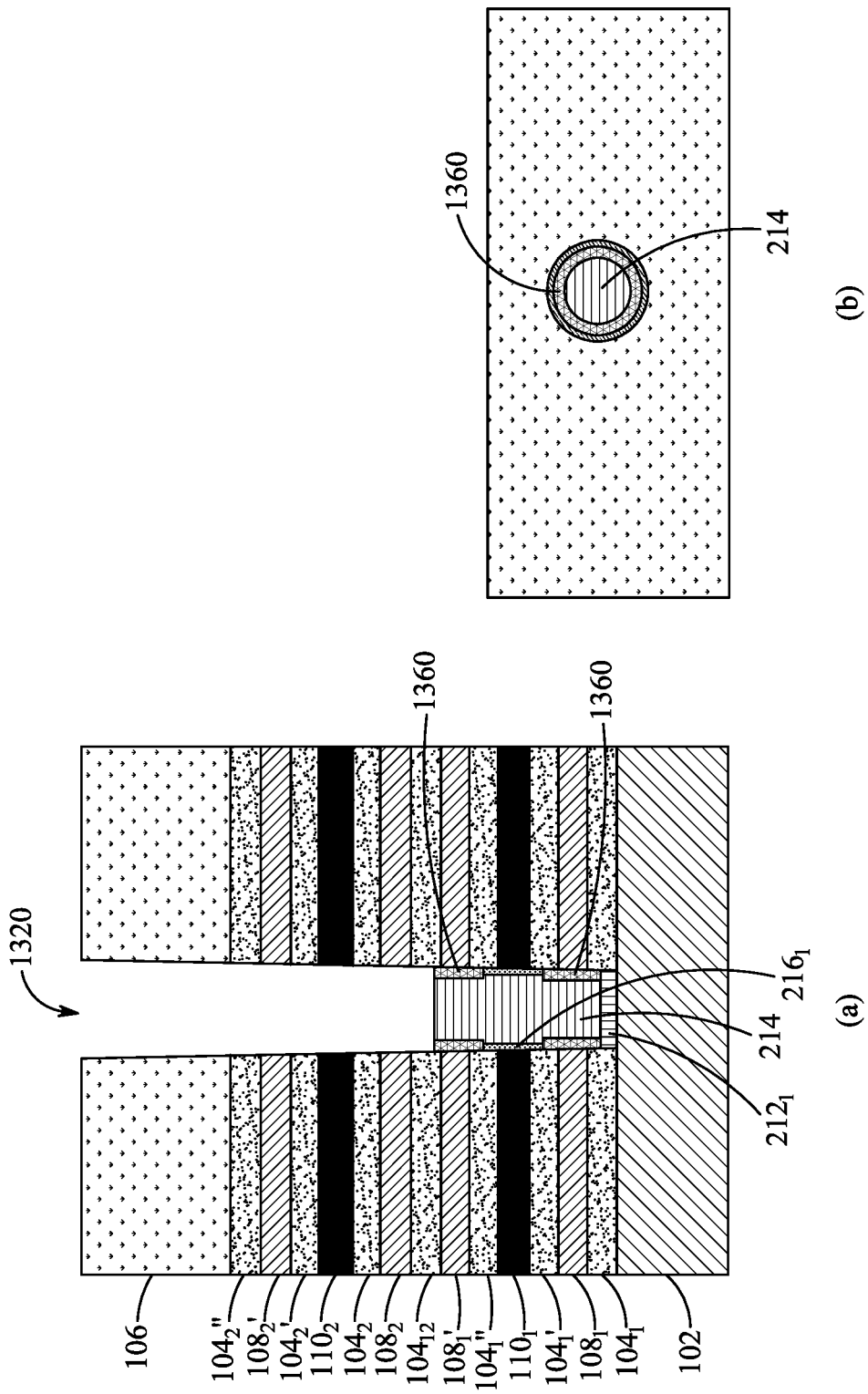
FIG. 13 shows a p-type vertical channel with a silicide metal surrounding the dielectric 8 layers, where $a$) is a cross-sectional view and $b$) is a top view, according to certain embodiments.
Figure 14:
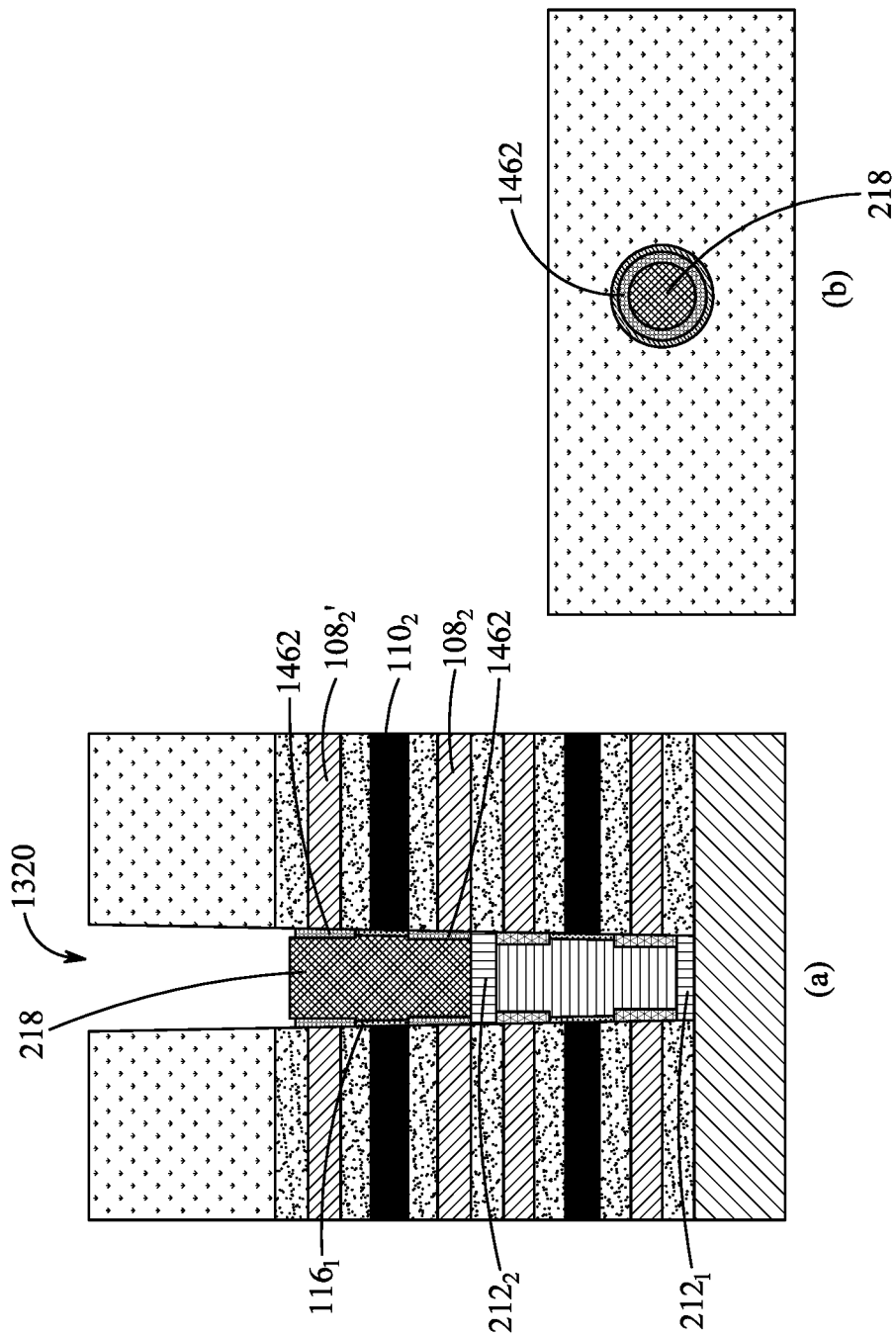
FIG. 14 shows an n-type vertical channel with a silicide metal surrounding the dielectric 8 layers, where $a$) is a cross-sectional view and $b$) is a top view, according to certain embodiments.
Figure 15:
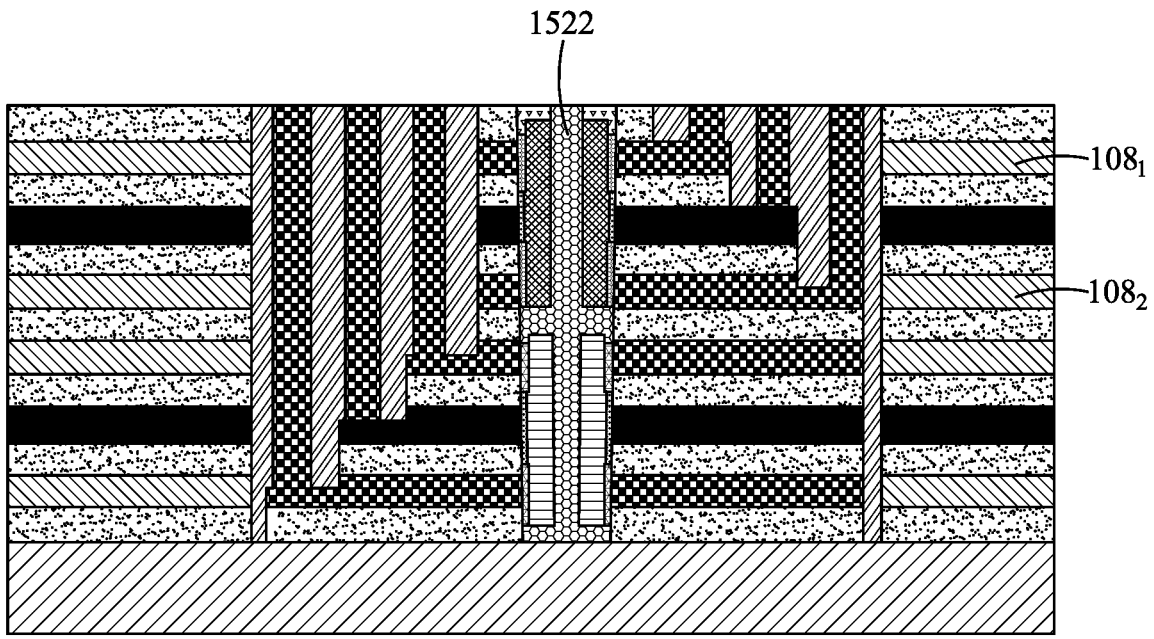
FIG. 15 depicts a completed transistor having different silicide metals in the n-type and p-type channels, where $a$) is a cross-sectional view and $b$) is a top view, according to certain embodiments.
Figure 15:
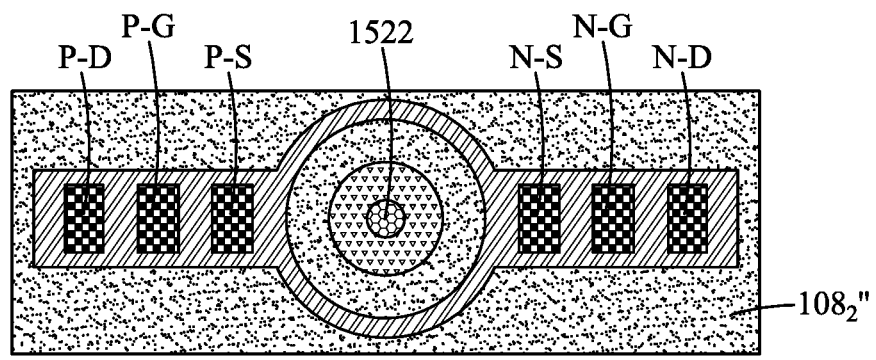

FIGS. 13-15 show option 2, which is an alternative flow in which a different silicide for p-doped vertical channels structures and n-doped channel structures is used with metal 2 filling. Metal for silicide is deposited at interfaces of dielectric 8 as the vertical channel structure is being grown. This can be by conformal deposition and etch back as with formation of the high-k interface described above. In this example, metal 3 is used for lower sub-stack while metal 4 is used for upper sub-stack. Annealing can be executed to form silicides.

In FIG. 13, cross-sectional view (a) is similar to the layer stack of FIG. 1, and common labels are used to show similar parts. Cross-sectional view (a) shows epitaxial growth of p-silicon 214 in the center of the stack through opening 1320 over $212_1$ of SiGe, which is grown at the bottom of the vertical channel 120 for later removal to isolate the vertical channel from the underlying layer of silicon 102. Metal 3 1360 is formed at the sides of the opening 1320 where the dielectric 8 portions of layer $108_1$ and layer $108_1'$ would touch the p-silicon 214. Metal 3 1360 may be formed by isotropic deposition of metal 3 followed by directional etching of the same to permit further epi growth of the p-Si. Then, isotropic etching of metal 3 is performed after the p-Si extends beyond the layer $108_1$ and layer $108_1'$ respectively. A high-k gate interface $216_1$ is also shown. FIG. 13(b) shows a top view looking through the opening 1320 showing the p-silicon 214 core surrounded by metal 3 1360.

In FIG. 14, the cross-sectional view (a) shows layer $212_2$ of SiGe, which is grown in opening 1320 for later removal to isolate the lower vertical channel from the upper vertical channel. Then n-silicon 218 is epitaxially grown and metal 4 1462 is deposited around the sides of the opening 1320 which contact layer $108_2$ and layer $108_2'$ of dielectric 8. A high-k layer $116_1$ which serves as the gate dielectric is also shown. The substrate is then annealed to form silicide from the metal 4. The top view (b) shows a slice through layer $108_2'$, showing the n-silicon 218 core surrounded by metal 4 1462.

In FIG. 15, cross-sectional view (a) shows an opening is formed through the vertical channels and the SiGe layers $212_1$ and $212_2$ shown in FIG. 14(a). The core opening is used to remove the SiGe layers $212_1$ and $212_2$, and a dielectric 1522 is deposited in the core opening. Metal formation to the source P-S, drain P-D and gate P-G of the p-silicon and to the source N-S, drain D-S and gate G-S of the n-silicon is completed as shown in the top view (b), followed by CMP planarization as detailed with respect to FIG. 3-FIG. 11.

Figure 16:
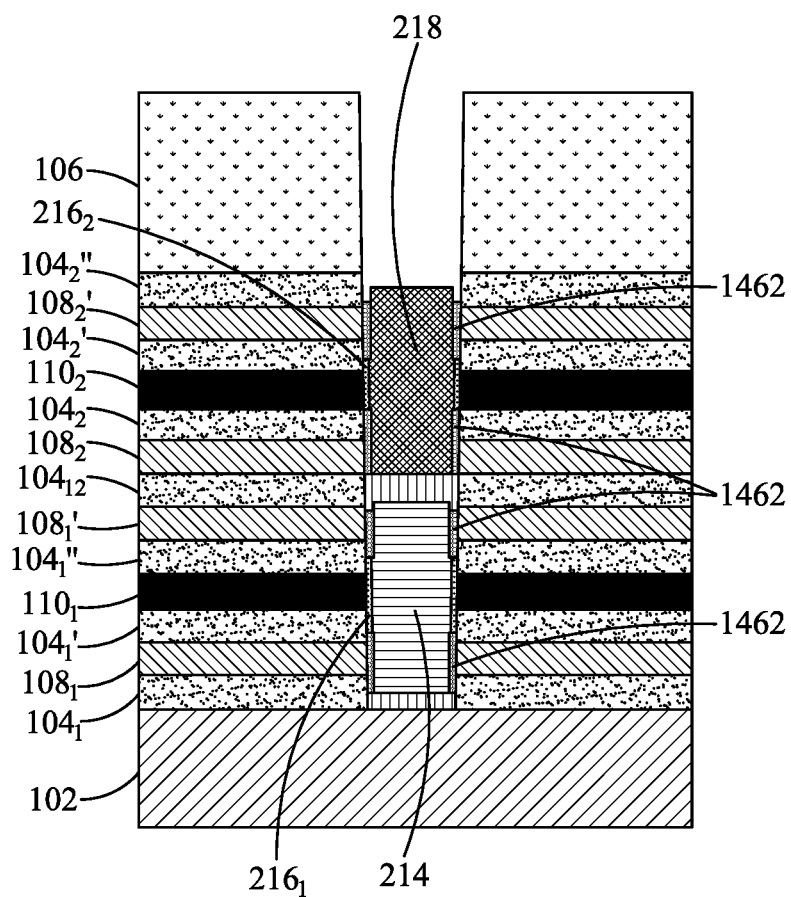
FIG. 16 shows an n-type and a p-type vertical channel with the same silicide metal surrounding the dielectric 8 layers, according to certain embodiments.
Figure 17:
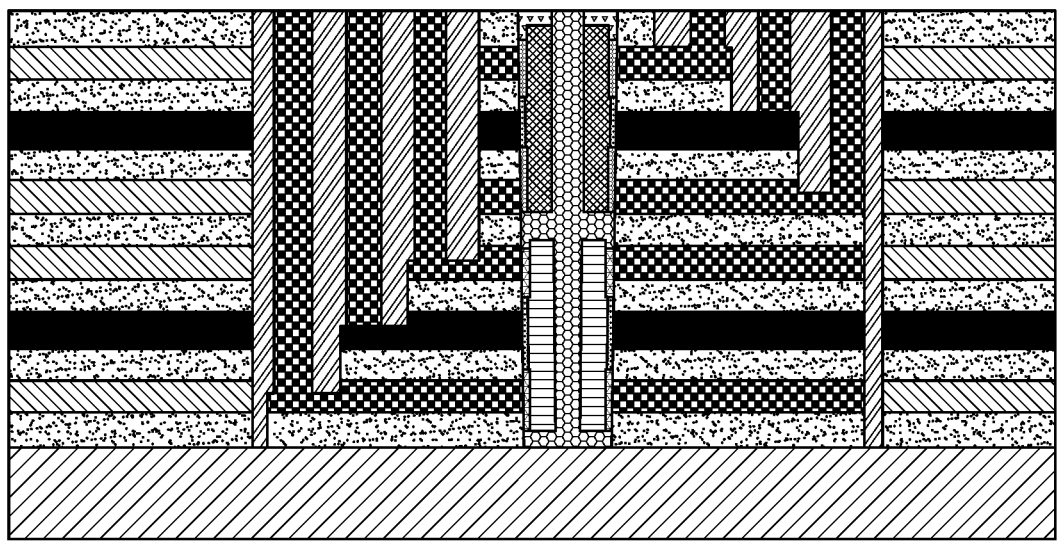
FIG. 17 depicts a completed transistor having the same silicide metal in the n-type and p-type vertical channels, where *a*) is a cross-sectional view and *b*) is a top view, according to certain embodiments.
Figure 17:
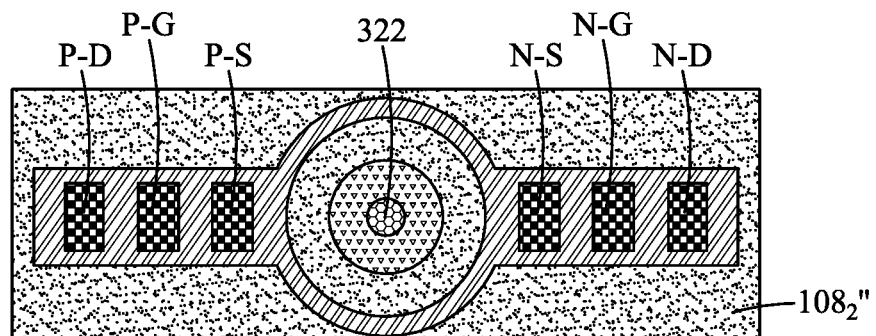

FIGS. 16-17 show option 3, which is an alternative flow in which the same metal is used for both p-Si and n-Si interfaces for forming a same silicide.

FIG. 16 is similar to FIGS. 2, 3 and 14 and common labels are used to refer to similar parts. In FIG. 16, metal 4 (1462) is formed around the p-silicon (214) and n-silicon (218) regions at layer $108_1$, layer $108_1'$, layer $108_2$ and layer $108_2'$ of dielectric 8. The p-silicon gate region is surrounded by high-k dielectric $216_1$ and the n-silicon gate region is surrounded by the high-k dielectric $216_2$. The substrate is annealed to form silicide from the metal 4. The process of Option 3 is not limited to using metal 4. Alternatively, metal 3 may be used to form the silicide in both the n and p vertical channels.

In FIG. 17, a cross-sectional view (a) of the finished transistor is shown. FIG. 17(b) shows a top view of the finished transistor. The dielectric core 322 and metal formation to the source P-S, drain P-D and gate P-G of the p-silicon and to the source N-S, drain D-S and gate G-S of the n-silicon are completed, followed by CMP planarization formed as detailed with respect to FIG. 3-FIG. 11.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of microfabrication, the method comprising:
forming a first layer stack on a substrate of alternating layers, the first layer stack layer having at least two sub-stacks, each sub-stack including a first metal layer positioned between two dielectric layers of a first dielectric material, the first metal layer and the two dielectric layers of the first dielectric material separated from each other by layers of a second dielectric material;
forming vertical channel structures extending through a channel opening of the first layer stack including a vertical channel structure for each sub-stack, the vertical channel structures formed by epitaxial growth, the vertical channel structures having a current flow path that is perpendicular to a surface of the substrate, the vertical channel structures for each sub-stack positioned so that the first metal layer is aligned for a gate contact and the two dielectric layers of the first dielectric material are aligned for source/drain contacts;
for each sub-stack, forming metal openings in the first layer stack that uncover the first metal layer and the two dielectric layers of the first dielectric material, wherein each metal opening is separated from other metal openings, wherein the openings are positioned at a radial location of the vertical channel structures;
isotropically removing accessible portions of the first dielectric material through the metal openings; and
filling the metal openings with a second metal resulting in second metal structures that extend horizontally from the vertical channel structures and vertically to a location above the vertical channel structure.

2. The method of claim 1, wherein the forming metal openings in the first layer stack results in a staircase profile opening of the first metal layer and the two dielectric layers of a first dielectric material.

3. The method of claim 1, further comprising isolating remaining portions of the first metal layer and remaining portions of the two dielectric layers of a first dielectric material from the vertical channel structures.

4. The method of claim 1, wherein openings for a given vertical channel structure are in a radially extending line with each other and positioned at a different radial location as compared to openings of a second vertical channel structure.

5. The method of claim 1, wherein forming the vertical channel structures includes depositing a silicide metal which interfaces with the second dielectric material.

6. The method of claim 5, wherein the silicide metal is annealed prior to forming the metal openings in the first layer stack.

7. The method of claim 1, wherein a first vertical channel structure of a first sub-stack includes a p-silicon material and a second vertical channel structure of a second sub-stack includes an n-silicon material, wherein the first vertical channel structure is a PMOS vertical channel structure, and the second vertical channel structure is an NMOS vertical channel structure.

8. The method of claim 7, wherein a first silicide metal is deposited for NMOS vertical channel structures and a second silicide metal is deposited for PMOS vertical channel structures.

9. The method of claim 8, wherein the first silicide metal and the second silicide metal are different metal materials.

10. The method of claim 8, wherein the first silicide metal and the second silicide metal are the same metal material.

* * * * *